(12) United States Patent
Labrecque

(10) Patent No.: US 6,434,071 B1
(45) Date of Patent: Aug. 13, 2002

(54) CIRCUIT AND METHOD OF SELECTIVELY ACTIVATING FEEDBACK DEVICES FOR LOCAL BIT LINES IN A MEMORY

(75) Inventor: Peter Normand Labrecque, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/971,126

(22) Filed: Oct. 4, 2001

(51) Int. Cl.[7] .................................................. G11C 7/00
(52) U.S. Cl. .................................... 365/203; 365/189.11
(58) Field of Search .............................. 365/203, 189.01

(56) References Cited

U.S. PATENT DOCUMENTS 5,007,023 A * 4/1991 Kim et al. ................... 365/203
6,333,881 B1 * 12/2001 Kusunoki et al. ........... 365/154

* cited by examiner

*Primary Examiner*—Huan Hoang
(74) *Attorney, Agent, or Firm*—Carr Law Firm, L.L.P.; Robert M. Carwell

(57) ABSTRACT

Precharge circuitry for reading a data bit from a memory having at least two local bit lines comprises at least two precharge transistors for precharging the at least two local bit lines, at least two "keeper" transistors for keeping the at least two local bit lines, and a NAND gate for receiving the data bit from the memory via one of the at least two local bit lines and switching the at least two "keeper" transistors. The precharge circuitry does not need an additional inverter for switching any of the "keeper" transistors, thereby eliminating additional capacitance associated with the inverter and reducing unnecessary power consumption associated with the "keeper" transistors. Preferably, the transistors used in the precharge circuitry are p-channel metal-oxide-semiconductor field effect transistors (MOSFETs).

17 Claims, 2 Drawing Sheets

CIRCUIT AND METHOD OF SELECTIVELY ACTIVATING FEEDBACK DEVICES FOR LOCAL BIT LINES IN A MEMORY

BACKGROUND OF THE INVENTION

1. Field of the Invention

The invention relates generally to a memory read operation and, more particularly, to selectively activating feedback devices for local bit lines in a memory.

2. Description of the Related Art

In a memory, there are read bit lines which are often dynamic nodes and must be precharged. The read bit lines have a number of memory cell outputs attached to them. The memory cell outputs can only pull the read bit lines low. Commonly, read bit lines are split into "local" read bit lines to reduce capacitive load and increase data-accessing speed. Therefore, there may be two or more "local" read bit lines in a memory.

Preferably, a p-channel metal-oxide-semiconductor field effect transistor ("MOSFET") is used to precharge a local read bit line high when a local read bit line reset clock signal (lcl_rbl_rst) is asserted low. After the lcl_rbl_rst clock signal has transitioned to a high state, a feedback device or transistor (also known as a "keeper transistor") will hold each local read bit line high until the lcl_rbl_rst clock signal transitions to a low state or a memory cell output discharges the local read bit line. Preferably, the feedback device will comprise a p-channel MOSFET smaller in size than the one used for precharging.

Conventionally, the feedback device is driven by an inverter having its input from the local read bit line. Such an inverter generally consists of transistors and thus will add more capacitance to read bit lines. This added capacitance will slow the response time of the local read bit lines, thereby slowing the data-reading process of the memory. Furthermore, the conventional configuration may consume more power than is necessary. This is because the conventional configuration requires an inverter for each feedback device or a local read bit line. For example, if there are two local read bit lines, two inverters are used to drive two feedback devices, each inverter driving one feedback device. Each of the feedback devices is used to hold the local read bit line high. In doing so, the feedback devices "fight" leakage and thus power is consumed. Since the two inverters function independently of each other, one inverter may keep a feedback device on in cases where the output of the feedback device does not affect the output of the entire precharge circuit. In such cases, therefore, having an inverter for each feedback device leads to more power consumption than is necessary.

Therefore, there is a need for an optimized circuit configuration that does not require as much capacitance and/or power as conventionally circuits.

SUMMARY OF THE INVENTION

The present invention provides a precharge circuit configured for reading a data bit from a memory having at least two local bit lines. The precharge circuit comprises a first precharge transistor connectable to a voltage source and a first local bit line of the memory for precharging the first local bit line, when the first precharge transistor is turned on. Additionally, a first keeper transistor is connectable to the voltage source and the first local bit line for keeping the first local bit line precharged, even after the first precharge transistor is turned off.

The precharge circuit further comprises a second precharge transistor connectable to the voltage source and a second local bit line of the memory for precharging the second local bit line, when the second precharge transistor is turned on. A second keeper transistor is also connectable to the voltage source and the second local bit line for keeping the second local bit line precharged, even after the second precharge transistor is turned off. A NAND gate is connectable to the first and second local bit lines for receiving the data bit from the memory, and connected to the first and second keeper transistors for switching the first and second keeper transistors.

Alternatively, a method is provided for reading a data bit from a memory having first and second local bit lines. The method comprises the steps of inputting the first and second local bit lines to a NAND gate, precharging the first and second local bit lines by turning on first and second precharge transistors, respectively. The first and second precharge transistors are connectable to a voltage source and the first and second local bit lines.

The method comprises the additional steps of turning on first and second keeper transistors, keeping the first and second local bit lines precharged by maintaining the first and second keeper transistors turned on, respectively, even after the first and second precharge transistors are turned off, inputting the data bit to the NAND gate via one of the first and second local bit lines, switching the first and second keeper transistors by the NAND gate, outputting an inverted value of the data bit from the NAND gate, when both the first and second precharge transistors are turned off, and obtaining the data bit by inverting the inverted value of the data bit. The first and second keeper transistors are connectable to the voltage source and the first and second local bit lines.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION

Figure 1:
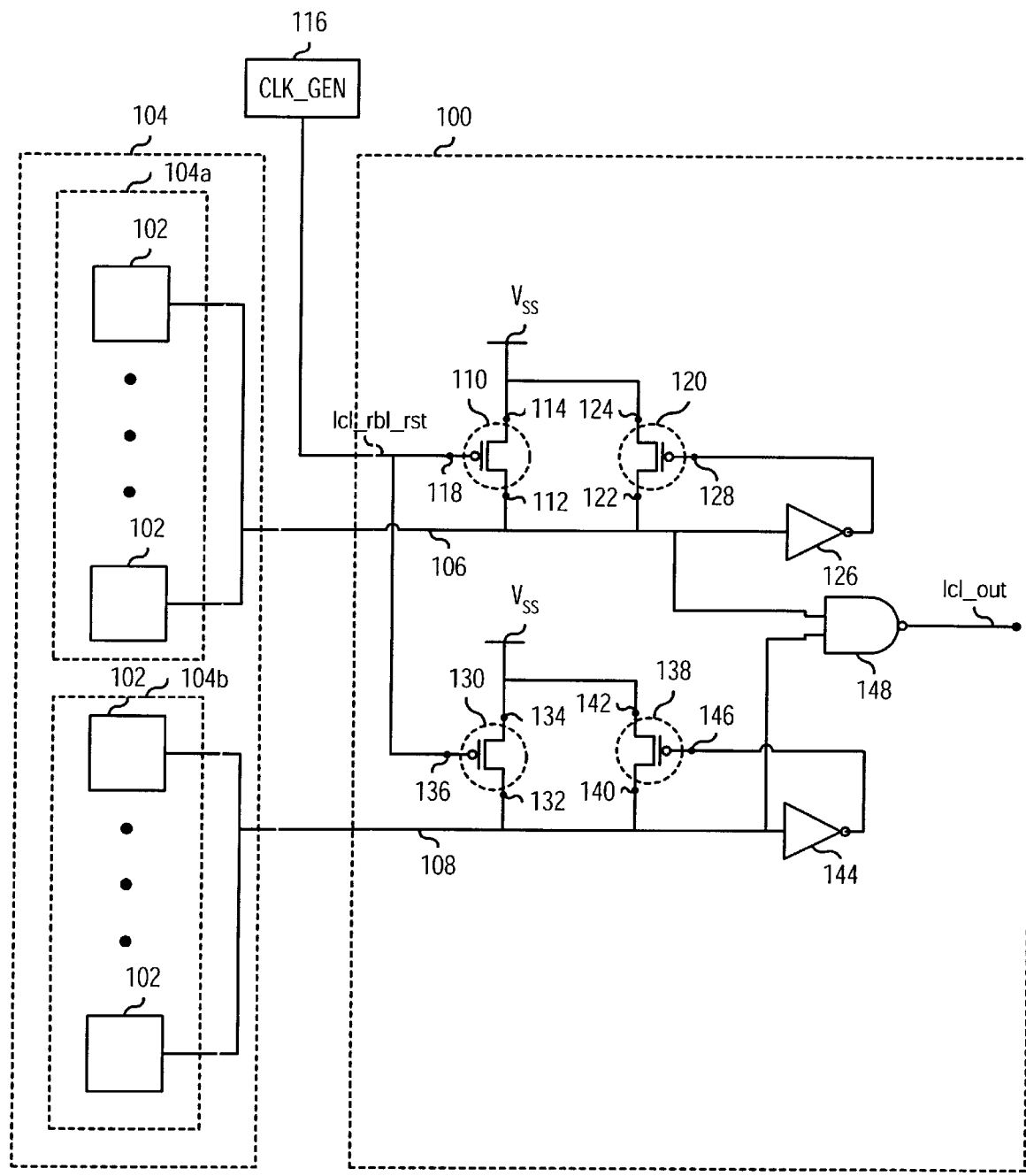
FIG. 1 depicts a conventional circuit used to read data bits from a memory, when there are two local read bit lines in a column of the memory.
Figure 2:
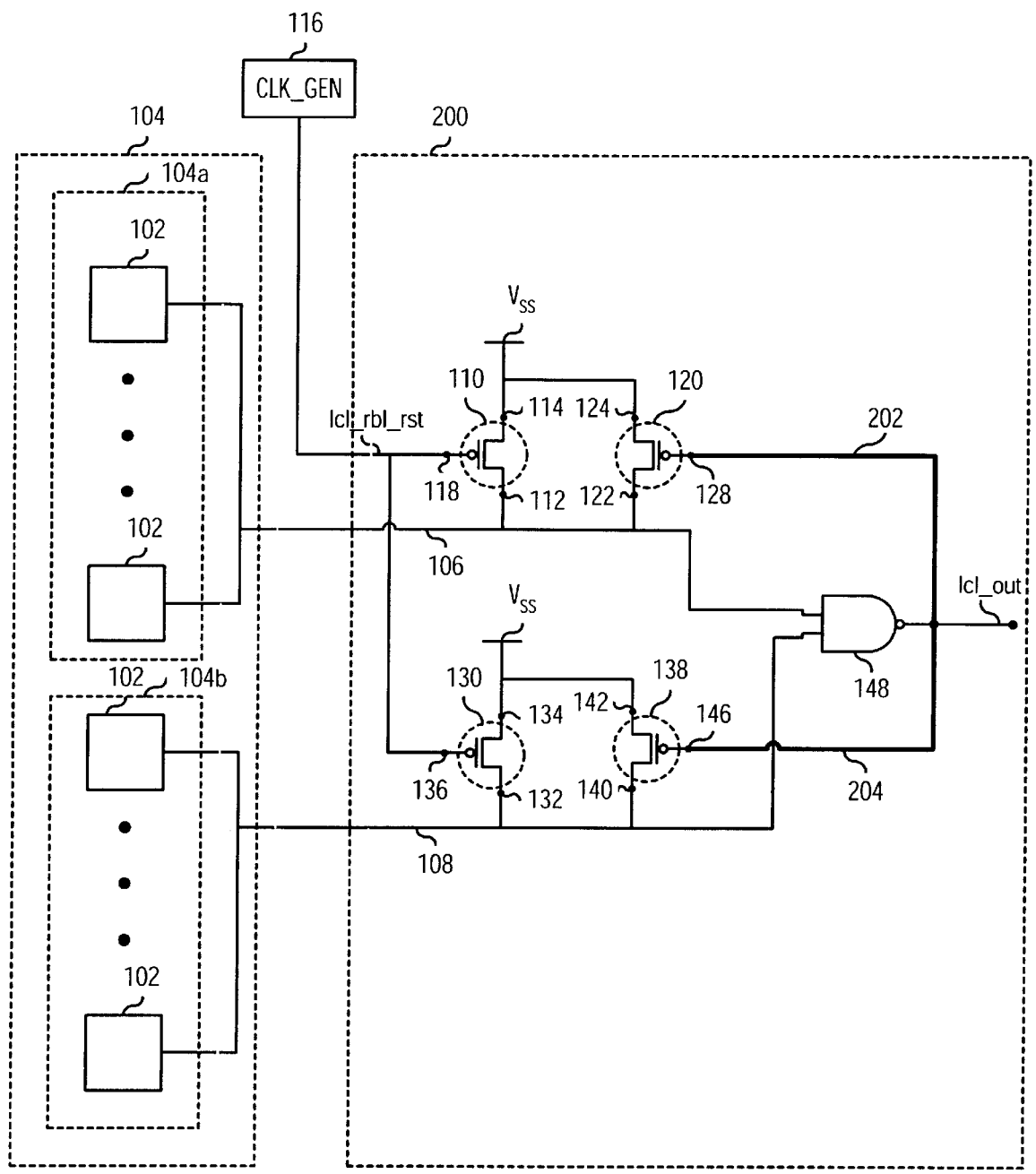
FIG. 2 depicts a new circuit embodying features of the present invention to read data bits from a memory, when there are two local read bit lines in a column of the memory.

The principles of the present invention and their advantages are best understood by referring to the illustrated operations of embodiment depicted in FIGS. 1–2.

In FIG. 1, a reference numeral 100 indicates a precharge circuit used in accordance with the prior art to read data bits from memory cells 102 in a column 104 of a memory (not shown in its entirety). Typically, each of the memory cells 102 comprises a plurality of transistors (not shown). Preferably, the output stage (not shown) of each memory cell 102 comprises one or more pull-down n-channel MOSFET (s) (not shown) in series. The number and type of transistors used in the memory cell 102 vary, depending on the type of the memory. The memory comprises a plurality of columns such as the column 104, each column having a plurality of rows. Examples of such a memory include a register file.

Generally, a bit line is a node that is connected to the outputs of a number of memory cells in one column. In some cases, however, a column is split into two or more groups of memory cells, and then the outputs of different groups are connected to different local bit lines. For example, a column may be split into two groups of memory cells. Memory cells in one group are connected to a first local bit line, whereas those in the other group are connected to a second local bit line. The memory cells 102 in the column 104 are divided into two groups 104a and 104b. The memory cells 102 in the group 104a are connected to a local bit line 106, whereas the memory cells 102 in the group 104b are connected to a local bit line 108. Generally, a column can be split into N groups of memory cells, wherein N=2, 3, 4 . . . The precharge circuit 100 and the column 104 correspond to a case where N=2.

The local bit line 106 is connected to a p-channel metal-oxide-semiconductor field effect transistor ("MOSFET") 110 through its drain node 112. The physical properties of a MOSFET are well-known in the art, and thus will not be described in detail. The p-channel MOSFET 110 is connected to a voltage source $V_{SS}$ through its source node 114 and to a lcl_rbl_rst clock generator CLK_GEN 116 through its gate node 118. Preferably, the CLK_GEN 116 generates a local read bit line reset clock signal (lcl_rbl_rst), which enables a read operation when the clock signal is high. Alternatively, the CLK_GEN 116 generates an internal memory clock signal (not shown), from which lcl_rbl_rst is derived. The local bit line 106 is also connected to a p-channel MOSFET 120 through its drain node 122. The p-channel MOSFET 120 is connected to the voltage source $V_{SS}$ through its source node 124 and to the output of an inverter 126 through its gate node 128. The input of the inverter 126 is connected to the local bit line 106, thereby being connected to the drain nodes 112 and 122, as well. Preferably, the inverter 126 comprises a pair of n- and p-channel MOSFETs (not shown).

The local bit line 108 is connected to a p-channel MOSFET 130 through its drain node 132. The p-channel MOSFET 130 is connected to the voltage source $V_{SS}$ through its source node 134 and to the lcl_rbl_rst clock generator CLK_GEN 116 through its gate node 136. Preferably, the output stage of each memory cell 102 comprises two n-channel MOSFETs (not shown), which forms a CMOS structure together with the p-channel MOSFET 110 or 130. The local bit line 108 is also connected to a p-channel MOSFET 138 through its drain node 140. The p-channel MOSFET 138 is connected to the voltage source $V_{SS}$ through its source node 142 and to the output of an inverter 144 through its gate node 146. Preferably, the inverter 144 comprises a pair of n- and p-channel MOSFETs (not shown). The input of the inverter 144 is connected to the local bit line 108, thereby being connected to the drain nodes 132 and 140, as well. The local bit lines 106 and 108 are input to a two-input NAND gate 148. Generally, a column of a memory could generally be split into N groups of memory cells, in which case an N-input NAND gate will be used to receive inputs from N local bit lines (N=2, 3, 4, . . . ). Preferably, the two-input NAND gate 148 comprises two n-channel MOSFETs (not shown) in series and two p-channel MOSFETs (not shown) in parallel for a total of four MOSFETs (not shown). In the aforementioned generalized case, the N-input NAND gate would comprise N n-channel MOSFETs in series and N p-channel MOSFETs in parallel for a total of 2N MOSFETs (N=2, 3, 4, . . . ). A local output (lcl_out) designates the output of the NAND gate 148.

In a typical read operation of a memory, a memory cell is selected by using an address (not shown) indicating the row and column to which the memory cell belongs. Since it is wellknown in the art, a detailed mechanism for selecting a memory cell using a given address is not provided herein. In FIG. 1, it is assumed that the column 104 contains a memory cell having a data bit to be read. In accessing the column 104, the two local bit lines 106 and 108 are used to read a data bit from one of the memory cells 102. The precharge circuit 100 reads a data bit from the memory cell 102, when the lcl_rbl_rst clock signal is in a "high" state, i.e., substantially larger than both the threshold voltages of the p-channel MOSFETs 110 and 130. Typically, the threshold voltages of the p-channel MOSFETs 110 and 130 will be a negative value.

In one mode of operation, the precharge circuit 100 cannot read a data bit from the memory cell 102, when the lcl_rbl_rst clock signal is in a "low" state. A quantitative value of a "high" or "low" state depends on the device characteristics of the p-channel MOSFETs 110 and 130 and is well-known in the field of the present invention, given specific device characteristics. Thus, no quantitative analysis will be provided herein. It is noted herein that the terms "high" and "low" states may be used interchangeably with terms "logical 1" and "logical 0", respectively, throughout the application.

When the lcl_rbl_rst clock signal is in a low state, the p-channel MOSFETs 110 and 130 are turned on, thereby "precharging" the local bit lines 106 and 108, respectively, up to the supply voltage $V_{SS}$ (a high state or logical 1). The p-channel MOSFETs 110 and 130 are therefore referred to as a "precharge transistor." The high values on the local bit lines 106 and 108 are then input to the inverters 126 and 144, respectively. From these "high" inputs, the inverters 126 and 144 output a "low" state, thereby turning on the p-channel MOSFETs 120 and 138, respectively. Since all four MOSFETs 110, 120, 130, and 142 are turned on, both the local bit lines 106 and 108 remain high in a steady state. This steady state will not be interrupted whether a data bit read from a selected memory cell 102 is a logical 1 or 0.

If the data bit is a logical 1, both the local bit lines 106 and 108 will definitely remain high. Even if the data bit is a logical 0, the local bit lines 106 and 108 will remain high, provided that each of the p-channel MOSFETs 110 and 130 is capable of handling the current flows required to maintain the local bit lines 106 and 108 in a high state, respectively. Generally, the p-channel MOSFETs 110 and 130 are capable of handling a current level required to maintain a high state in the local bit lines 106 and 108, respectively, when a selected memory cell 102 contains a data bit of a logical 0 (low). Therefore, a data bit can be read only when the lcl_rbl_rst clock signal is in a high state.

When the lcl_rbl_rst clock signal is high, the p-channel MOSFETs 110 and 130 are turned off. Still, the local bit lines 106 and 108 may stay high, because the p-channel MOSFETs 120 and 138 remain turned on from the previous cycle of the lcl_rbl_rst clock signal. This is true insofar as a selected memory cell 102 contains a data bit of a logical 1 (or high). If a selected memory cell 102 contains a data bit of a logical 0 (or low), then whether the local bit lines 106 and 108 will remain high or transition to a low state depends on the properties of the p-channel MOSFETs 120 and 138, respectively. For example, such properties include the width/length (W/L) ratios of the p-channel MOSFETs 120 and 138. Preferably, the p-channel MOSFETs 120 and 138 are "weak" transistors. That is, the p-channel MOSFETs 120 and 138 have a low gain (small W/L ratio). Therefore, the p-channel MOSFETs 120 and 138 are not capable of handling a current level required to maintain a high state in the local bit lines 106 and 108, respectively. For example, if a selected memory cell 102 contains a data bit of a logical 0 (or low) and belongs to the group 104a, then the p-channel MOSFET 120 will be "overpowered" and fail to maintain a high state in the local bit line 106. That is, a pull-down transistor of the selected memory cell 102 discharges the local bit line 106 to a low state (or logical 0). Since the local bit line 106 is input to the NAND gate 148, the output lcl_out of the NAND gate 148 has a high state (or logical 1).

Alternatively, if a selected memory cell 102 contains a data bit of a logical 0 (or low) and belongs to the group 104b, then the p-channel MOSFET 138 will be "overpowered" and fail to maintain a high state in the local bit line 108. That is, a pull-down transistor of the selected memory cell 102 discharges the local bit line 108 to a low state (or logical 0). Since the local bit line 108 is input to the NAND gate 148, the output lcl_out of the NAND gate 148 has a high state (or logical 1). Therefore, the NAND gate 148 outputs an inverted value of the data bit read from a memory cell 102. The data bit is obtained by inverting the output lcl_out.

As mentioned above, FIG. 1 can be expanded to a case where a column is split into N groups of memory cells connected to N local bit lines input to an N-input NAND gate N=2, 3, 4, . . . ). The aforementioned circuit analysis will still be applicable to this generalized case.

Now referring to FIG. 2, a precharge circuit 200 depicts a preferred embodiment of the present invention. The precharge circuit 200 contains improvements upon the precharge circuit 100 of FIG. 1. In the precharge circuit 200, the inverter 126 is taken out of the precharge circuit 100, while the output lcl_out of the NAND gate 148 is fed back to the gate node 128 of the p-channel MOSFET 120 through a connection 202 (depicted in a thicker line). Similarly, the inverter 144 is taken out of the precharge circuit 100, while the output lcl_out of the NAND gate 148 is fed back to the gate node 146 of the p-channel MOSFET 138 through a connection 204 (depicted in a thinker line). Except for these changes, all the other blocks and circuit components with reference numerals used in FIG. 1 are connected substantially the same way as in FIG. 1.

As in FIG. 1, it is assumed that the column 104 contains a memory cell having a data bit to be read. In accessing the column 104, the two local bit lines 106 and 108 are used to read a data bit from one of the memory cells 102. The precharge circuit 200 reads a data bit from the memory cell 102, when the lcl_rbl_rst clock signal is in a high state.

As mentioned above in relation to FIG. 1, the precharge circuit 200 cannot read a data bit from the memory cell 102, when the lcl_rbl_rst clock signal is in a low state. When the lcl_rbl_rst clock signal is in a low state, the p-channel MOSFETs 110 and 130 are turned on, thereby "precharging" the local bit lines 106 and 108, respectively, up to the supply voltage $V_{SS}$ (a high state or logical 1). The p-channel MOSFETs 110 and 130 are therefore known as a "precharge transistor." The high values on the local bit lines 106 and 108 are then input to the two-input NAND gate 148. From these "high" inputs, the NAND gate 148 outputs a "low" state, thereby turning on the p-channel MOSFETs 120 and 138, respectively. Since all four MOSFETs 110, 120, 130, and 142 are turned on, both the local bit lines 106 and 108 remain high in a steady state. This steady state will not be interrupted whether a data bit read from a selected memory cell 102 is a logical 1 or 0. If the data bit is a logical 1, both the local bit lines 106 and 108 will definitely remain high. Even if the data bit is a logical 0, the local bit lines 106 and 108 will remain high, provided that each of the p-channel MOSFETs 110 and 130 is capable of handling the current flows required to maintain the local bit lines 106 and 108 in a high state, respectively. Generally, the p-channel MOSFETs 110 and 130 are capable of handling a current level required to maintain a high state in the local bit lines 106 and 108, respectively, when a selected memory cell 102 contains a data bit of a logical 0 (low). Therefore, a data bit can be read only when the lcl_rbl_rst clock signal is in a high state.

When the lcl_rbl_rst clock signal is high, the p-channel MOSFETs 110 and 130 are turned off. Still, the local bit lines 106 and 108 may stay high, because the p-channel MOSFETs 120 and 138 remains turned on from the previous cycle of the lcl_rbl_rst clock signal. This is true insofar as a selected memory cell 102 contains a data bit of a logical 1 (or high). If a selected memory cell 102 contains a data bit of a logical 0 (or low), then it depends on the properties of the p-channel MOSFETs 120 and 138, respectively, whether the local bit lines 106 and 108 will remain high or transition to a low state. For example, such properties include the W/L ratios of the p-channel MOSFETs 120 and 138. Preferably, the p-channel MOSFETs 120 and 138 are "weak" transistors. That is, the p-channel MOSFETs 120 and 138 have a low gain (small W/L ratio). Therefore, the p-channel MOSFETs 120 and 138 are not capable of handling a current level required to maintain a high state in the local bit lines 106 and 108, respectively. For example, if a selected memory cell 102 contains a data bit of a logical 0 (or low) and belongs to the group 104a, then the p-channel MOSFET 120 will be "overpowered" and fail to maintain a high state in the local bit line 106. That is, a pull-down transistor of the selected memory cell 102 discharges the local bit line 106 to a low state (or logical 0). Since the local bit line 106 is input to the NAND gate 148, the output lcl_out of the NAND gate 148 has a high state (or logical 1).

Alternatively, if a selected memory cell 102 contains a data bit of a logical 0 (or low) and belongs to the group 104b, then the p-channel MOSFET 138 will be "overpowered" and fail to maintain a high state in the local bit line 108. That is, a pull-down transistor of the selected memory cell 102 discharges the local bit line 108 to a low state (or logical 0). Since the local bit line 108 is input to the NAND gate 148, the output lcl_out of the NAND gate 148 has a high state (or logical 1).

Therefore, the logic operation of the precharge circuit 200 is substantially the same as that of the precharge circuit 100 of FIG. 1, despite the fact that the inverters 126 and 144 are removed, and that the output lcl_out of the NAND gate 148 was connected to the gate nodes 128 and 146 to control the p-channel MOSFETs 120 and 138, respectively. While maintaining substantially the same logic operation, the precharge circuit 200 reduces capacitance on the local bit lines 106 and 108 by removing the inverters 106 and 108.

Moreover, when the local bit line 106 or 108 is discharged, power consumption is reduced by turning off both the p-channel MOSFETs 120 and 138, as opposed to turning off only one of the p-channel MOSFETs 120 and 138 as in the precharge circuit 100 of FIG. 1. In the precharge circuit 100, the inverters 126 and 144 function independently of each other. For example, in FIG. 1, if the bit line 106 is discharged, then the inverter 126 turns off the p-channel MOSFET 128. However, the inverter 144 does not turn off the p-channel MOSFET 144, because the local bit line 108 is not discharged. Therefore, the p-channel MOSFET 144 in this example remains turned on, and thus additional power is consumed.

In contrast, in the precharge circuit 200 of FIG. 2, the output lcl_out of the NAND gate 148 controls both the gate nodes 128 and 146. Therefore, in the above example where the bit line 106 is discharged, the output lcl_out of the NAND gate 148 will transition to a high state, thereby turning off both the p-channel MOSFETs 128 and 146. Accordingly, virtually no power will be consumed by the p-channel MOSFET 146. This example shows that the NAND gate 148 turns off both the p-channel MOSFETs 120 and 138, when at least one of the local bit lines 106 and 108 is discharged during a read operation.

Except for these advantages of the precharge circuit 200, the output lcl_out of the NAND gate 148 has the same logical value as in the precharge circuit 100. Therefore, the NAND gate 148 outputs an inverted value of the data bit read from a memory cell 102. The data bit is obtained by inverting the output lcl_out.

As mentioned above in relation to FIG. 1, FIG. 2 can be expanded to a case where a column is split into N groups of memory cells connected to N local bit lines input to an N-input NAND gate (N=2, 3, 4, . . . ). The aforementioned circuit analysis will still be applicable to this generalized case. Since the circuit analysis of this generalized case is straightforward and will be easily understood by a person with ordinary skill in the art upon a review of the present description, such analysis will not be provided herein.

It will be understood from the foregoing description that various modifications and changes may be made in the preferred embodiment of the present invention without departing from its true spirit. This description is intended for purposes of illustration only and should not be construed in a limiting sense. The scope of this invention should be limited only by the language of the following claims.

What is claimed is:

1. A precharge circuit configured for reading a data bit from a memory having at least two local bit lines, the precharge circuit comprising:

a first precharge transistor connectable to a voltage source and a first local bit line of the memory for precharging the first local bit line, when the first precharge transistor is turned on;

a first keeper transistor connectable to the voltage source and the first local bit line for keeping the first local bit line precharged, even after the first precharge transistor is turned off;

a second precharge transistor connectable to the voltage source and a second local bit line of the memory for precharging the second local bit line, when the second precharge transistor is turned on;

a second keeper transistor connectable to the voltage source and the second local bit line for keeping the second local bit line precharged, even after the second precharge transistor is turned off; and a NAND gate connectable to the first and second local bit lines for receiving the data bit from the memory, and connected to the first and second keeper transistors for switching the first and second keeper transistors.

2. The precharge circuit of claim 1, wherein the first and second precharge transistors and the first and second keeper transistors are each a p-channel metal-oxide-semiconductor field effect transistor ("MOSFET").

3. The precharge circuit of claim 1, wherein the first and second precharge transistors and the first and second keeper transistors are each a p-channel MOSFET, wherein the drain nodes of the first precharge and first keeper transistors are connectable to the first local bit line, and the drain nodes of the second precharge and second keeper transistors are connectable to the second local bit line, wherein the source nodes of the first and second precharge transistors and the first and second keeper transistors are connectable to the voltage source, and wherein the gate nodes of the first and second precharge transistors are controlled by a local read bit line reset clock signal, and the gate nodes of the first and second keeper transistors are controlled by an output of the NAND gate.

4. The precharge circuit of claim 1, wherein the NAND gate is configured to output an inverted value of the data bit when both the first and second precharge transistors are turned off.

5. The precharge circuit of claim 1, wherein the NAND gate is configured to output an invalid data bit when both the first and second precharge transistors are turned on.

6. The precharge circuit of claim 1, wherein the NAND gate is configured to turn off both the keeper transistors, when at least one of the first and second local bit lines is discharged.

7. The precharge circuit of claim 1, wherein the first keeper transistor is configured to become overpowered and the first local bit line is configured to be discharged, when the data bit of a logical 0 is placed on the first local bit line.

8. The precharge circuit of claim 1, wherein the second keeper transistor is configured to become overpowered and the second local bit line is configured to be discharged, when the data bit of a logical 0 is placed on the second local bit line.

9. The precharge circuit of claim 1, wherein the first and second precharge transistors have a larger gain than the first and second keeper transistors, respectively.

10. A method for reading a data bit from a memory having first and second local bit lines, comprising the steps of:

inputting the first and second local bit lines to a NAND gate;

precharging the first and second local bit lines by turning on first and second precharge transistors, respectively, the first and second precharge transistors being connectable to a voltage source and the first and second local bit lines;

turning on first and second keeper transistors;

keeping the first and second local bit lines precharged by maintaining the first and second keeper transistors turned on, respectively, even after the first and second precharge transistors are turned off, the first and second keeper transistors being connectable to the voltage source and the first and second local bit lines;

inputting the data bit to the NAND gate via one of the first and second local bit lines;

switching the first and second keeper transistors by the NAND gate;

outputting an inverted value of the data bit from the NAND gate, when both the first and second precharge transistors are turned off; and obtaining the data bit by inverting the inverted value of the data bit.

11. The method of claim 10, wherein the first and second precharge transistors and the first and second keeper transistors are each a p-channel metal-oxide-semiconductor field effect transistor ("MOSFET").

12. The method of claim 10, wherein the first and second precharge transistors and the first and second keeper transistors are each a p-channel MOSFET, the method further comprising the steps of:

connecting the drain nodes of the first precharge and first keeper transistors to the first local bit line;

connecting the drain nodes of the second precharge and second keeper transistors to the second local bit line;

connecting the source nodes of the first and second precharge transistors and the first and second keeper transistors to the voltage source; and controlling the gate nodes of the first and second precharge transistors by a local read bit line reset clock signal; and controlling the gate nodes of the first and second keeper transistors by an output of the NAND gate.

13. The method of claim 10, further comprising the step of outputting an invalid data bit when both the first and second precharge transistors are turned on.

14. The method of claim 10, further comprising the step of turning off both the keeper transistors by the NAND gate, when at least one of the first and second local bit lines is discharged.

15. The method of claim 10, further comprising the steps of:

overpowering the first keeper transistor; and discharging the first local bit line, when the data bit of a logical 0 is placed on the first local bit line.

16. The method of claim 10, further comprising the steps of:

"overpowering" the first keeper transistor; and discharging the first local bit line, when the data bit of a logical 0 is placed on the first local bit line.

17. The method of claim 10, wherein the first and second precharge transistors have a larger gain than the first and second keeper transistors, respectively.

* * * * *

UNITED STATES PATENT AND TRADEMARK OFFICE
CERTIFICATE OF CORRECTION

PATENT NO. : 6,434,071 B1
DATED : August 13, 2001
INVENTOR(S) : Peter Normand Labrecque It is certified that error appears in the above-identified patent and that said Letters Patent is hereby corrected as shown below:

<u>Column 5,</u>
Line 24, delete "N=2, 3, 4, ...)" and insert -- (N=2, 3, 4, ...) --

Signed and Sealed this

Fourth Day of February, 2003

JAMES E. ROGAN
*Director of the United States Patent and Trademark Office*